United States Patent [19]

Mukherjee et al.

[11] Patent Number: 5,229,312
[45] Date of Patent: Jul. 20, 1993

[54] NONVOLATILE TRENCH MEMORY DEVICE AND SELF-ALIGNED METHOD FOR MAKING SUCH A DEVICE

[75] Inventors: Satyendranath Mukherjee, Yorktown Heights; Manjin Kim, Ossining, both of N.Y.

[73] Assignee: North American Philips Corp., New York, N.Y.

[21] Appl. No.: 867,595

[22] Filed: Apr. 13, 1992

[51] Int. Cl.⁵ .................. H01L 21/265; H01L 21/70
[52] U.S. Cl. ........................................ 437/43; 437/48; 437/52
[58] Field of Search ........................ 437/43–52; 357/23.5; 365/185

[56] References Cited

U.S. PATENT DOCUMENTS

| | | | |
|---|---|---|---|
| 5,057,896 | 10/1991 | Gotou | 357/23.6 G |
| 5,065,201 | 11/1991 | Yamachi | 357/23.5 |
| 5,072,269 | 12/1991 | Hieda | 357/23.6 G |
| 5,126,807 | 6/1992 | Baba et al. | 357/23.5 |

FOREIGN PATENT DOCUMENTS

| | | | |
|---|---|---|---|
| 0282022 | 9/1988 | European Pat. Off. | 356/149 |
| 63-168053 | 7/1988 | Japan | 437/43 |
| 1-245539 | 9/1989 | Japan | 437/67 |

*Primary Examiner*—Olik Chaudhuri
*Assistant Examiner*—Loc Q. Trinh
*Attorney, Agent, or Firm*—Steven R. Biren

[57] ABSTRACT

A nonvolatile trench memory device such as an EEPROM is made by a method which permits an extremely compact and simple configuration due to the use of precise and efficient self-alignment techniques. Oxide-capped polysilicon mesas, formed integrally with the control gates, form the word lines of the memory device, while drain metallization lines contact drain regions of the device and extend over the oxide-capped word lines to form the bit lines. The resulting device is extremely compact, since the self-aligned process permits tighter tolerances and the unique polysilicon mesa-/oxide cap construction permits a more compact configuration.

7 Claims, 3 Drawing Sheets

NONVOLATILE TRENCH MEMORY DEVICE AND SELF-ALIGNED METHOD FOR MAKING SUCH A DEVICE

BACKGROUND OF THE INVENTION

The invention is in the field of nonvolatile trench memories, and relates specifically to memory devices such as Electrically Erasable and Programmable Read Only Memory (EEPROM) Devices and methods for making such devices.

EEPROM devices in general, and methods for making such devices, are well known in the art. Some typical prior-art memory devices and methods are shown and discussed in Japanese Kokai Nos. 1-227477, 1-20668, 62-269363, 61-256673 and 3-1574. Additional background concerning memory cell configurations and technology is provided in "A 0.5μ BiCMOS Technology for Logic and 4Mbit-class SRAM's", R. Eklund, et al, IEDM89-425 and "A 3.6μ$^2$ Memory Cell Structure for 16MB EPROMS", Y. S. Hisamune, et al, IEDM89-583. Finally, an EEPROM device with a trench structure similar to that of the present invention is shown in U.S. patent application Ser. No. 610,598 now U.S. Pat. No. 5,146,426, of Mukherjee et al, filed Nov. 8, 1990, and incorporated herein by reference. As discussed in the last-mentioned reference, one of the ongoing goals of memory device technology is to create device designs and fabrication techniques which will result in simple, compact and easy-to-manufacture devices.

In the past, using conventional lithographic techniques, alignment tolerances and drain contact metallization have limited both the degree of simplification and the degree of size reduction that could be obtained. Japanese Kokai No. 1-20668, for example, is directed to improved density and size reduction in PROM devices. Nevertheless, in that reference, a complex structure is employed in which the word line clearly overlaps the trench, and in which the drain contact metallization must be laterally isolated from surrounding parts of the device by separate insulation regions. Both of these features increase the size and complexity of the resulting device.

Using prior-art techniques, the smallest known EEPROM cell has a cell area of 3.6 microns$^2$. Although the trench memory cell configuration lends itself to further size reduction because the channel can be stretched in the vertical direction to avoid operational problems without increasing device area, the potential advantages of this device configuration have not heretofore been fully realized due to conventional lithography alignment tolerances and space-consuming drain-contact metallization configurations.

SUMMARY OF THE INVENTION

It is therefore an object of the present invention to provide a nonvolatile trench memory device such an EEPROM device in which the aforementioned limitations on achieving the full size-reduction potential of the trench configuration are eliminated.

It is a further object of the invention to provide a nonvolatile trench memory device having an extremely simple and compact configuration.

Yet another object of the invention is to provide a simple, efficient and economical method for manufacturing highly-compact nonvolatile trench memory devices as EEPROMs.

In accordance with the invention, these objects are achieved by a unique nonvolatile trench memory device, and a method of making such a device, which results in an extremely compact, efficient, economical, and easy-to-manufacture memory device.

As noted above, prior-art attempts to achieve simplification and size reduction have been limited by wordline overlap in the lateral direction and by the need for lateral isolation regions for insulating the drain contact metallization. In order to overcome these drawbacks and achieve a substantial further reduction in memory-cell size and complexity, a method is need to fabricate word lines, which, together with their lateral insulation, are no wider than the trench width, and in which the drain contact metallization can be isolated from the word lines without the provision of additional, separate insulation regions in the lateral direction.

In order to achieve these objectives, a nonvolatile trench memory device in accordance with the invention is fabricated using a unique self-aligned method which permits an extremely compact and simple device configuration.

The advantageous features of the present invention are achieved by a process in which polysilicon mesas are formed integrally with the control gates, with the mesas extending above the surface of the body region and extending between trenches in which the memory devices are formed so as to form the word lines of the memory device. The top and sides of these mesas are then oxidized to create a capping insulating layer that isolates the word lines without taking up any additional space in the lateral direction. Bit lines can then be formed in a direction perpendicular to that of the word lines, and can contact drain regions of the device and extend directly over the oxide-capped word lines without the necessity for any addition bit-line isolation regions in the lateral direction. Due to the extensive use of self-aligned process techniques, extremely tight tolerances can be maintained without regard for lithographic tolerances, and the end result is an extremely compact, simple and easy to manufacture device.

It should be noted that the Figures are not drawn to scale, and that various dimensions and proportions may be exaggerated for improved clarity.

DESCRIPTION OF THE PREFERRED EMBODIMENT

Figure 1:
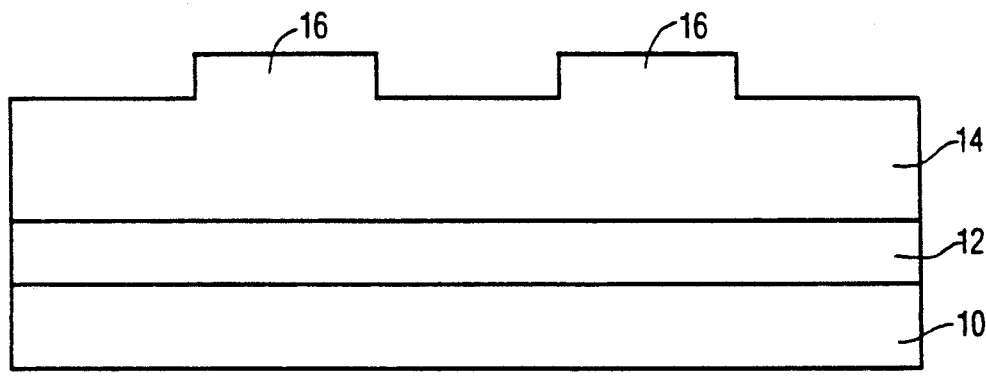
FIGS. 1-9 show a nonvolatile trench memory device in accordance with the invention, in successive stages of manufacture.
Figure 2:
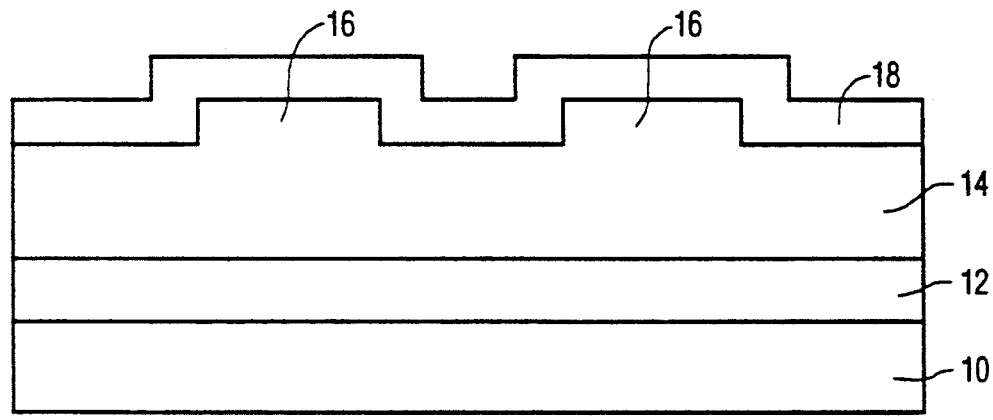
Figure 3:
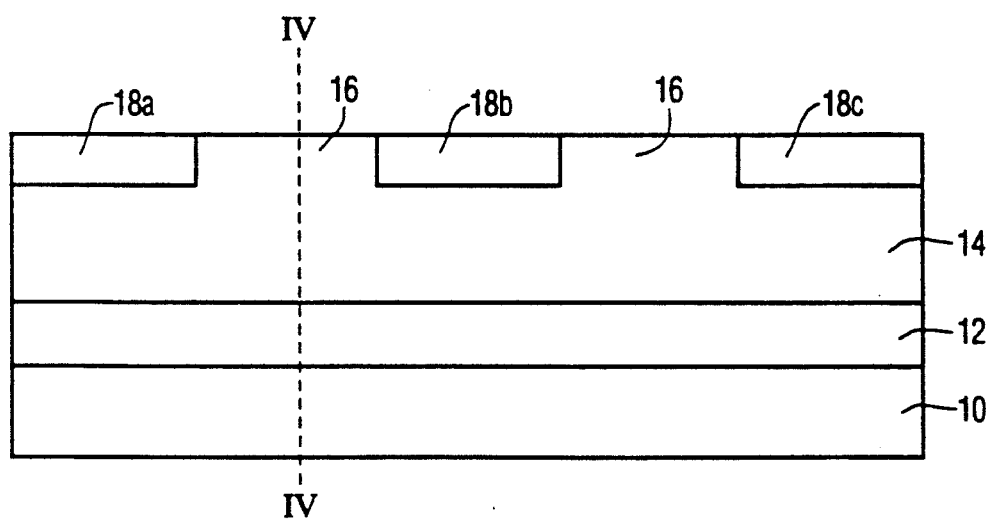

FIGS. 1-3 of the drawing show three early stages of the manufacture a nonvolatile trench memory device in accordance with the invention. With reference to FIG. 1, the starting material may typically be an n++ substrate 10 having a doping level of about $10^{21}$ atom/cm$^3$. In the finished device, the substrate will ultimately form a low-resistance common source of the memory. An n-type epitaxial layer 12 having a thickness of about 3.0 microns and a doping concentration of about $10^{16}$ atoms/cm$^3$ is formed on the substrate, and a p-type body region 14 having a thickness of about 1.7 microns and a surface concentration of about $10^{17}$ atoms/cm$^3$ is formed on the epitaxial layer 12 by doping into the epitaxial layer. Using conventional masking and anisotropic etching techniques, spaced-apart mesas 16 are formed which extent parallel to each other in a direction perpendicular to the view shown in FIG. 1. The thickness of these mesas is about 0.5 micron, so that the thickness of portions of the body region 14 located between the mesas 16 is about 1.2 microns.

An oxide layer 18, having a thickness of about 0.5 microns, and which may typically be a deposited low-temperature oxide, is then formed over the mesas 16 and the remaining portions of the upper surface of the body region 14, to result in the structure as shown in FIG. 2.

Using a resist planarization technique, the oxidized surface of the body region 14 is then planarized down to the level of the mesas 16 to achieve a substantially flat surface 20 having alternating oxide stripes (18a, 18b, 18c) and mesas (16) which extent parallel to each other in a direction perpendicular to the view shown in FIG. 3.

Figure 4:
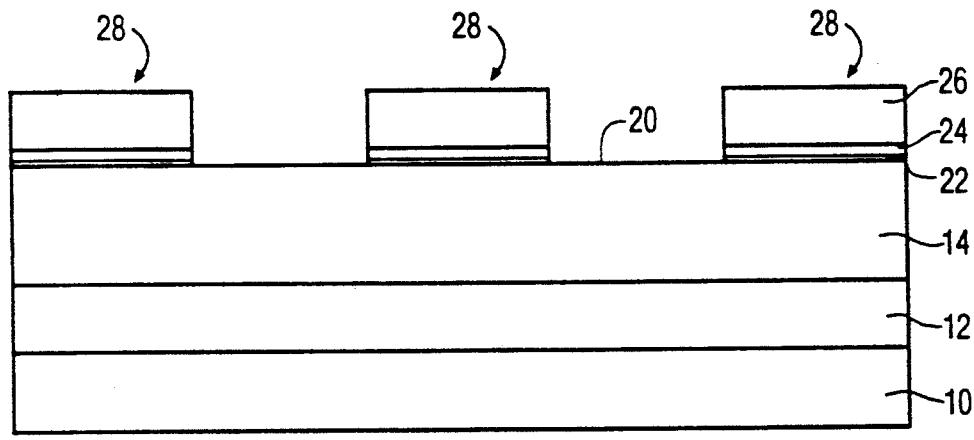

Referring now to FIG. 4, which is a cross-sectional view taking along the section line IV—IV in FIG. 3, a thin pad oxide 22, of about 0.03 microns thickness, is formed on surface 20. A silicon nitride layer 24 which is about 0.1 microns thick is formed on pad oxide 22 and a thick LTO (low temperature oxide) layer 26 which is about 1 micron thick is deposited on the nitride layer 24. In a second masking and etching step, this triple layer 22, 24, 26 is then formed into a plurality of spaced-apart second mesas 28 on the surface 20 which extent parallel to each other in a direction perpendicular to that of the oxide stripes 18a, 18b, and 18c.

At this point in the fabrication process, the device, viewed from above, has a series of first mesas 16 extending as stripes in a first direction between oxide stripes 18a, 18b, and 18c, as shown in FIG. 3, with a series of spaced-apart second mesas 28 extending parallel to each other in a direction perpendicular to that of the first mesas, as shown in FIG. 4. This structure forms a lattice configuration, when viewed from above, with square or rectangular portions of first mesas 16 being defined on a first pair of sides by oxide stripes 18a, 18b, 18c, and on a second pair of sides by the second mesas 28. The exposed rectangular or square portions of the first mesas 16 are then etched, using the oxide lattice as a mask, until trenches 30 which extend down through body region 14 and into epitaxial layer 12 are formed. These trenches, viewed from above, will have a square or rectangular shape, as defined by the oxide lattice.

Figure 5:
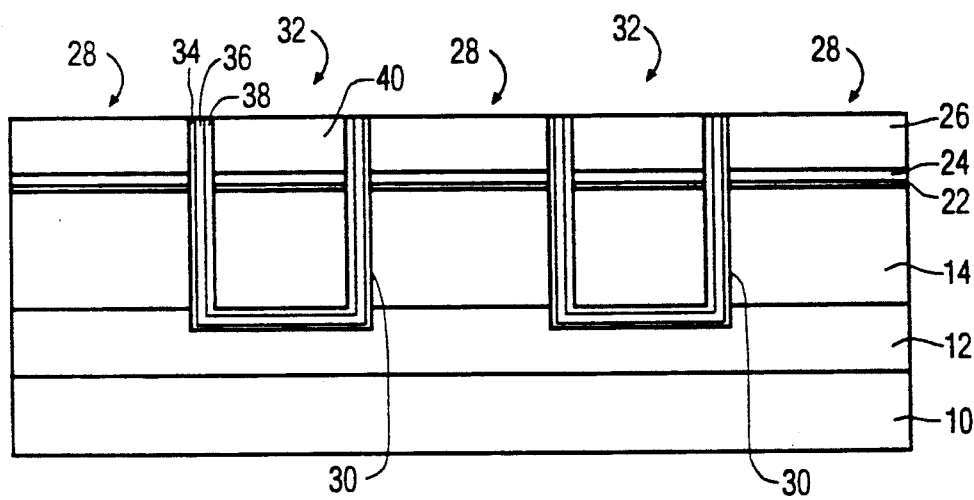

Individual memory cells 32 are formed in the trenches 30 by forming, consecutively, a thin gate dielectric layer 34, typically an oxide layer having a thickness of about 0.01–0.02 microns, on the side walls and bottom of the trenches 30. A polysilicon floating gate electrode 36, typically 0.1 microns thick, is then formed on the gate oxide 34, and is covered with an inter-gate dielectric 38, which may typically be an ONO (oxide, nitride, oxide) layer of about 0.03 microns thickness. The remaining open portion of the trench is then filled with a polysilicon control gate electrode 40, with the polysilicon gate electrodes being planarized at the level of the upper surface of the second mesas 28 to create a flat upper surface at this stage of the process, as shown in FIG. 5. It should be noted that the polysilicon which forms the gate electrodes extends not only into the trenches 30, as shown in FIG. 5, but also extends between memory cells 32 in a direction perpendicular to the view of FIG. 5, as shown by polysilicon portions 40a in FIG. 7 extending between the control gate electrodes 40.

The top oxide layer 26 of the second mesas 28 is then selectively etched away down to the nitride layer 24, thus leaving the upper polysilicon portions of the gate electrodes above the level of the nitride layer 24 exposed. The exposed portions of the polysilicon gate electrodes above the level of nitride layer 24 are then thermally oxidized, using the nitride layer 24 as an oxidation mask, to form insulating oxide caps 42 on the top and sides of the exposed portions of polysilicon. The sidewall oxidation is self-limited because of the ONO between the floating gate polysilicon and the control gate polysilicon. This ensures that sufficient control gate polysilicon remains to permit conduction of word line signals. The resulting structure at this stage of the manufacturing process is shown in FIG. 6.

Figure 6:
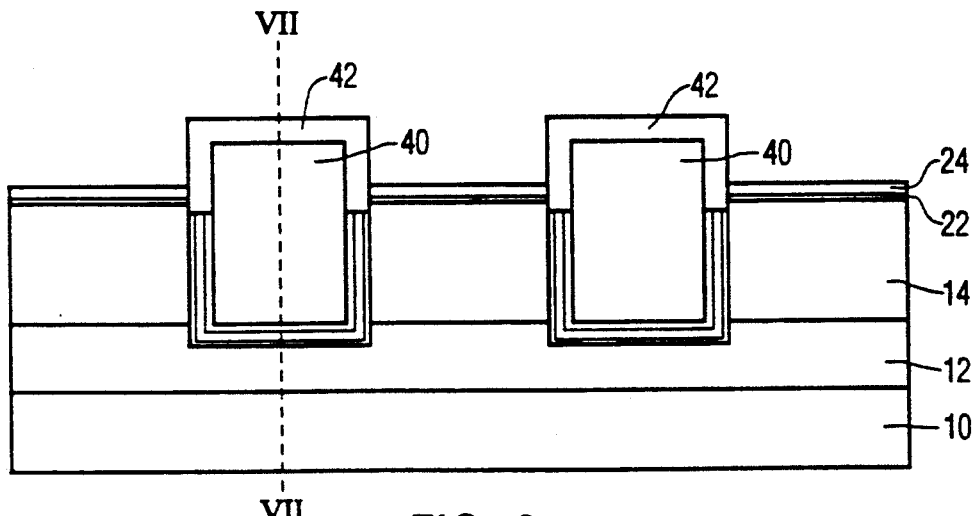
Figure 7:
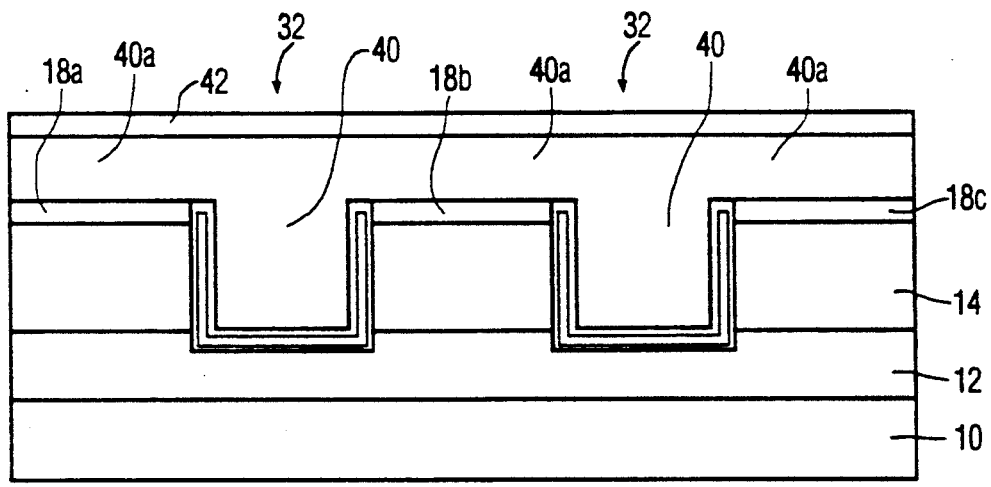

FIG. 7 shows a cross-sectional view of the device along the section line VII—VII in FIG. 6. In FIG. 7, it can be clearly seen that the polysilicon of the control gate electrodes 40 also has portions 40a which extend in the lateral direction between memory cells 32 to form word lines of the memory device. It can also be seen that the word lines are insulated from above by the insulating oxide cap 42, and from below by the oxide stripes 18a, 18b and 18c.

Figure 8:
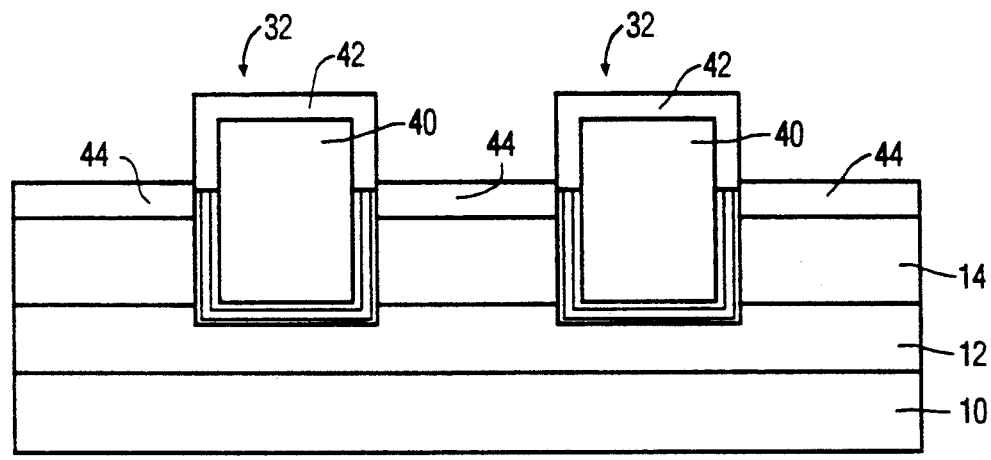

Returning now to the view shown in FIG. 6, the device is further processed by forming drain regions 44 of n+ conductivity type in surface-adjoining portions of the body region 14 between the memory cells 32, as shown in FIG. 8. These drain regions may typically be 0.4 microns thick and have a doping level of about $10^{20}$ atoms/cm$^3$. The drain regions may be formed by a number of different conventional techniques, such as ion implantation through the layers 22 and 24 (see FIG. 6), or by first removing the nitride layer 24 and then implanting through oxide layer 22. After formation of the drain regions, part, or all (as shown), of the remaining portions of layers 22 and 24 are removed, by self-aligned contact formation, in which the nitride 24 is selectively removed by wet chemical etching, leaving the thin oxide layer 22. Since the thickness of oxide layer 22 is much less than that of the polysilicon oxide cap, oxide layer 22 can easily be removed, without exposing the polysilicon, to form a self-aligned contact to each drain. At least part of the drain regions 44 are exposed, as shown in FIG. 8

Figure 9:
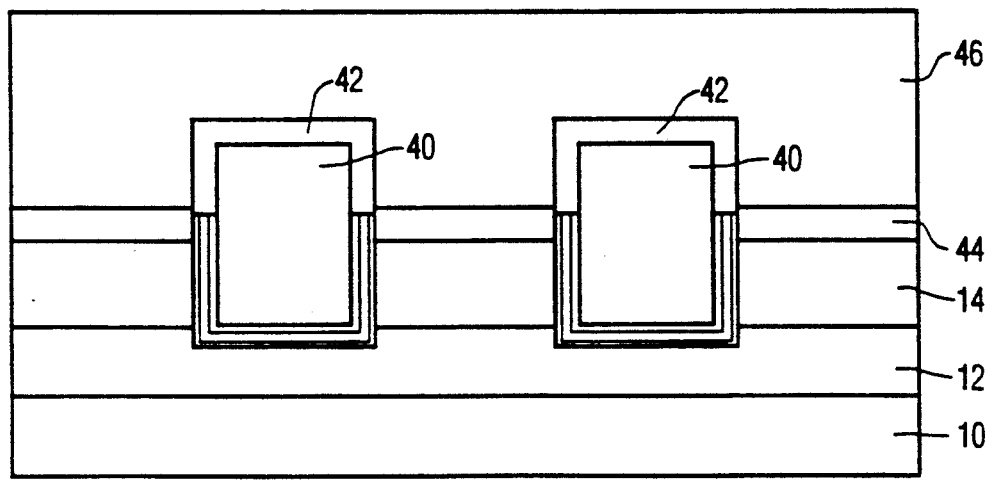

Finally, drain metallization lines 46 are then formed on the drain regions 44 and the insulating oxide caps 42, as shown in FIG. 9, in a third masking operation using conventional masking and etching techniques. These drain metallization lines extend in a direction perpendicular to the polysilicon word lines and thus form the bit lines of the memory device.

By the extensive use of self-alignment techniques, the previously-described method yields an extremely compact, simple and easy to manufacture device. Whereas about 15 masks are typically needed to fabricate such a device using prior-art techniques, the method of the present invention permits the fabrication of a more compact device while requiring the use of only 3 masks, as described, plus an additional contact mask, thus resulting in substantially simplification while at the same time achieving superior results.

While the invention has been particularly shown and described with reference to several preferred embodiments thereof, it will be understood by those skilled in the art that various changes in form and detail may be made without departing from the spirit and/or scope of the invention.

We claim:

1. A method of making a nonvolatile trench memory device, which comprises:

providing a substrate of a first conductivity type which forms a common source region of said device;

forming an epitaxial layer of said first conductivity type on said substrate;

forming a body region of a second conductivity type opposite to that of the first on said epitaxial layer;

forming a plurality of spaced-apart first mesas at a surface of said body region which extend parallel to each other in a first direction;

forming an oxide layer on the surface of said body region having said first mesas;

planarizing said surface to provide a substantially flat surface with oxide stripes extending in said first direction parallel to each other and between said first mesas;

forming a plurality of spaced-apart second mesas on said flat surface which extend parallel to each other in a second direction substantially orthogonal to said first direction, said second mesas each being formed of a first, surface-adjoining layer of oxide, a second layer of nitride, and a third layer of oxide;

forming a plurality of trenches in spaced-apart portions of said body region located between said first mesas and between said second mesas, said trenches extending at least through said body region to said epitaxial layer;

forming a plurality of memory cells in said trenches, each memory cell being formed of, consecutively, a thin gate dielectric, a polysilicon floating gate electrode, an inter-gate dielectric and a polysilicon control gate electrode, said polysilicon gate electrodes being planarized at the level of the surface of said second mesas, and the polysilicon of at least said control gate electrodes also extending between memory cells in the second direction;

removing the third layer of said second mesas so that upper portions of said polysilicon of at least said control gate electrodes form a plurality of spaced-apart third mesas which extend parallel to each other in said second direction;

oxidizing the top and sides of said upper portions of said polysilicon to form an insulating layer over and around said third mesas, said third mesas forming insulated polysilicon word lines of said memory device;

forming drain regions of said first conductivity type in surface-adjoining portions of said body region between said oxide stripes and between said memory cells;

at least partly removing said first and second layers of said second mesas over said drain regions; and forming drain metallization lines on said drain regions and the oxidized upper portions of said polysilicon, said drain metallization lines extending in said first direction to form bit lines of said memory device.

2. A method of making a nonvolatile trench memory device as in claim 1, wherein said oxide layer is formed on the surface of said body region by oxidizing said surface.

3. A method of making a nonvolatile trench memory device as in claim 1, wherein said oxide layer is formed on the surface of said body region by depositing a low-temperature oxide on said surface.

4. A method of making a nonvolatile trench memory device as in claim 1, wherein said third layer of oxide is formed by depositing a low-temperature oxide.

5. A method of making a nonvolatile trench memory device as in claim 1, wherein said trenches are rectangular trenches.

6. A method of making a nonvolatile trench memory device as in claim 1, wherein said trenches are square trenches.

7. A method of making a nonvolatile trench memory device as in claim 1, wherein said inter-gate dielectric is formed of an oxide-nitride-oxide layer.

* * * * *